United States Patent
Miller et al.

[11] Patent Number: 5,349,288
[45] Date of Patent: Sep. 20, 1994

[54] RADIAL PLANAR CURRENT DETECTION DEVICE HAVING AN EXTENDED FREQUENCY RANGE OF RESPONSE

[76] Inventors: John S. Miller, 8023 Naylor Ave., Los Angeles, Calif. 90045; Hugh M. Hyatt, 1655 Riente St., Camarillo, Calif. 93010

[21] Appl. No.: 940,643

[22] Filed: Sep. 4, 1992

[51] Int. Cl.$^5$ .................................. G01R 1/04
[52] U.S. Cl. .................................. 324/126; 324/127; 324/95; 333/22 R; 343/700 MS
[58] Field of Search ............... 324/126, 109, 102, 95; 333/22 R; 343/700 MS

[56] References Cited

U.S. PATENT DOCUMENTS

| | | | |
|---|---|---|---|
| 2,588,564 | 3/1952 | Pawlicki | 324/126 |
| 3,234,461 | 2/1966 | Trent et al. | 324/40 |
| 3,245,021 | 4/1966 | Kernander et al. | 338/233 |
| 3,657,650 | 4/1972 | Arndt | 324/126 |
| 3,686,569 | 8/1972 | Neilsen | 324/126 |
| 4,041,373 | 8/1977 | Maringer | 324/126 |
| 4,334,187 | 6/1982 | DeSantis | 324/126 |
| 4,369,447 | 1/1983 | Edney | 343/700 MS |
| 4,384,289 | 5/1983 | Stillwell et al. | 324/126 |
| 4,719,414 | 1/1988 | Miller et al. | 324/126 |
| 4,804,917 | 2/1989 | Miller et al. | 324/126 |
| 4,814,713 | 3/1989 | Van Brunt et al. | 324/539 |
| 4,821,040 | 4/1989 | Johnson et al. | 343/700 MS |
| 5,121,127 | 6/1992 | Toriyama | 343/700 MS |

*Primary Examiner*—Kenneth A. Wieder
*Assistant Examiner*—Barry C. Bowser
*Attorney, Agent, or Firm*—Henry M. Bissell

[57] ABSTRACT

Electrostatic discharge (ESD) sensing apparatus for testing and displaying extremely high frequency discharges. The apparatus incorporates a surface mounted current shunt in the form of a thin foil or film of less than one skin depth thickness at the frequency of interest. This is sandwiched between a coaxial connector base plate and a ground plane mounting plate. The foil or film is symmetrically oriented about the axis of the connector at a central opening in the mounting plate. A discharge path is provided through the opening to the foil and, on the other side, through a small resistor to the central conductor of the coaxial connector which may be connected to a measuring or display apparatus for a complete test system. A calibration unit includes a plurality of sensing devices configured for different cutoff frequencies and levels of discharge pulses.

23 Claims, 2 Drawing Sheets

RADIAL PLANAR CURRENT DETECTION DEVICE HAVING AN EXTENDED FREQUENCY RANGE OF RESPONSE

BACKGROUND OF THE INVENTION

1. Field of the Invention.

The present invention relates generally to a device for detecting and measuring the magnitude of an externally generated current passing radially through a planar metallic conductor that radially terminates a coaxial-conductor-configured sense line and, more particularly, to such a device capable of detecting and measuring electric current over an extended frequency range.

2. Description of the Related Art.

The detection and measurement of electric currents through application of the general principle of induction is well known, as exemplified by clamp-on magnetic loops with inductively coupled coils of wire used to measure the alternating magnetic field of the current. The wire loops generally limit the use to about 100,000,000 Hertz (100 MHz). The clamp-on probe is not applicable in a coaxial circuit where low reflection is required.

Conventionally, the detection of voltage is commonly achieved through a high value resistor for isolation which is subject to capacitive coupling errors at frequencies of about 100 MHz or above. Modern amplifiers are so output-load-tolerant that often a matching load is not utilized. This results in high currents into essentially shorted test setups, thus making a voltage probe not applicable.

Discrete resistive elements in various series/parallel combinations having special configurations are utilized to detect electrical signals, such as electrostatic discharge (ESD), but these also exhibit inductive and capacitive effects that distort the signal and provide misleading test information near gigahertz ($10^9$ Hertz) frequencies.

The use of a resistive foil, current detecting device, inserted as part of the ground shield return path of a coaxial connector (described in U.S. Pat. No. 4,804,917 of John S. Miller, one of the inventors herein) is possible through utilization of a coaxial configuration that essentially eliminates capacitive and inductive pickup and therefore is mostly pure resistance, even at fractional ohmic levels and at frequencies higher than 1 gigahertz. Another current detection device utilizing thin resistive foil laid down on the outer surface of an annular dielectric substrate is disclosed in U.S. Pat. No. 4,719,414 of John S. Miller et al.

It is, therefore, a primary object and aim of the present invention to provide a coaxial termination, current detection device capable of achieving an exceptionally wide range of frequency response, namely, D.C. to 10 gigahertz.

Another object is to provide such a current detection device incorporated into a test arrangement for detecting and measuring electrical discharge onto a container that is, or simulates, the equipment to be tested. One example would be a test method for identifying the electrostatic discharge susceptibility of electronic equipment utilizing the device to identify the imparted current waveshape to assure meeting the requirements of applicable technical standards at various test locations.

SUMMARY OF THE INVENTION

In accordance with the present invention, a current detection device includes an annular dielectric substrate with a thin (e.g., less than one skin depth[1] at maximum frequency) resistive metal foil or film laid down across the end of the dielectric (as compared to "on a cylindrical surface" as is identified in the above-referenced Miller patent). The outer and inner conductors make full contact with the surface of the foil or film in disc fashion and extend outwardly to conduct the signal to the measuring device. A series coaxial impedance valued matching resistor, to reduce the effect of standing waves, may be installed in the center conductor as close as practical to the foil or film. This forms a coaxial termination that may be from a few milliohms to nearly an ohm resistance, depending upon metal conductivity, metal thickness and contact resistance plus the ohmic value of the matching resistor, if any.

[1] the depth below the surface of a conductor carrying current at a given frequency at which the current density has decreased one neper below the current density at the surface. For a given material, skin depth is a root function of resistivity divided by permeability and frequency.

The current handling capability of such an embodiment increases with thickness or conductivity (less electrical resistance and more physical shock resistance). The frequency capability decreases as thickness or conductivity increases (current attenuation sets in at a thickness larger than one skin depth). Magnetic material would be subject to changing its magnetic characteristics and thus changing its skin depth, which makes it less applicable.

The radial planar foil or film termination produces a largely resistive output to the coax leads if the foil or film is connected to an external input signal so as to produce a nearly uniform radial current flow that mutually cancels most of its own magnetic field. This is accomplished with the current input at the center, which is on the opposite side from the center lead of the terminated coax, with the foil or film input return at an annular perimeter coaxial and planar to the center input lead or arc point. Input current applied in this manner will provide uniform current flow to maximize magnetic field cancellation if current penetration is uniform. Non-uniform current penetration occurs at frequencies above skin depth frequency due to thickness variations in the metal with resultant non-uniform attenuation of the current as seen by the coax line side of device.

The terminating and input circuit of the present invention is known as a four terminal measuring set-up where the input current and output current are separated at the foil or film terminations. This minimizes the problem of unstable or high contact resistance. However, the low resistance value of the foil or film when combined with pressure contact, rather than soldered joints, justifies precious metal plating, such as a gold flash, on surfaces that contact the foil or film or matching resistor device. If the foil or film itself is subject to oxidation and thus significant contact resistance change, its contact areas should be plated appropriately.

BRIEF DESCRIPTION OF THE DRAWINGS

A better understanding of the present invention may be realized from a consideration of the following detailed description, taken in conjunction with the accompanying drawings in which.

DESCRIPTION OF THE PREFERRED EMBODIMENTS

Figure 1:
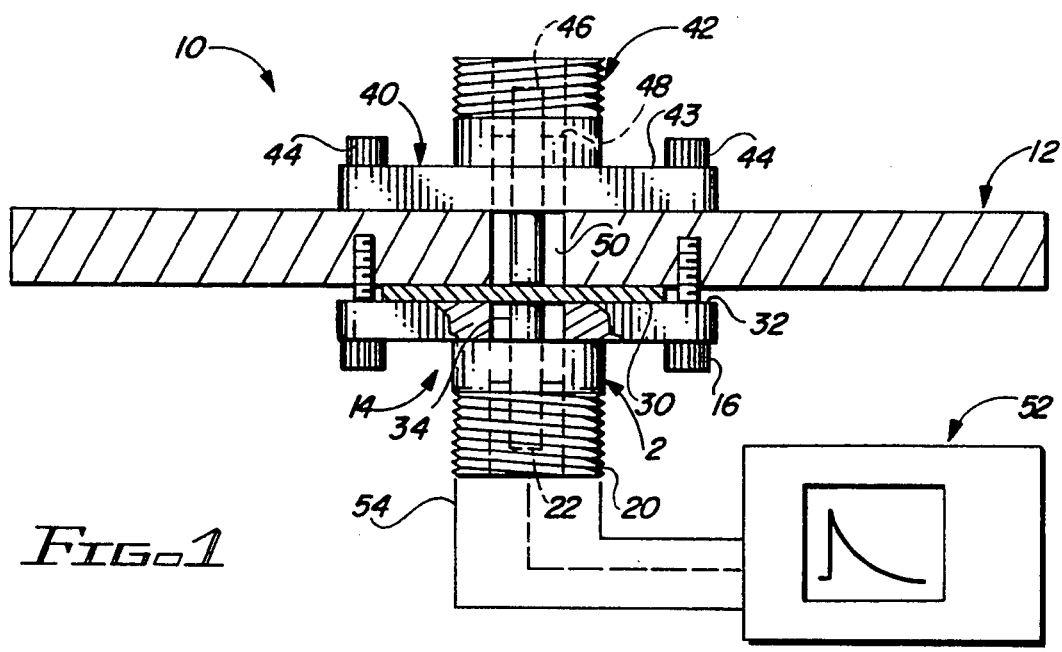
FIG. 1 is a schematic diagram showing one particular arrangement in accordance with the present invention in partial cross-sectional view in combination with a display apparatus.
Figure 1A:
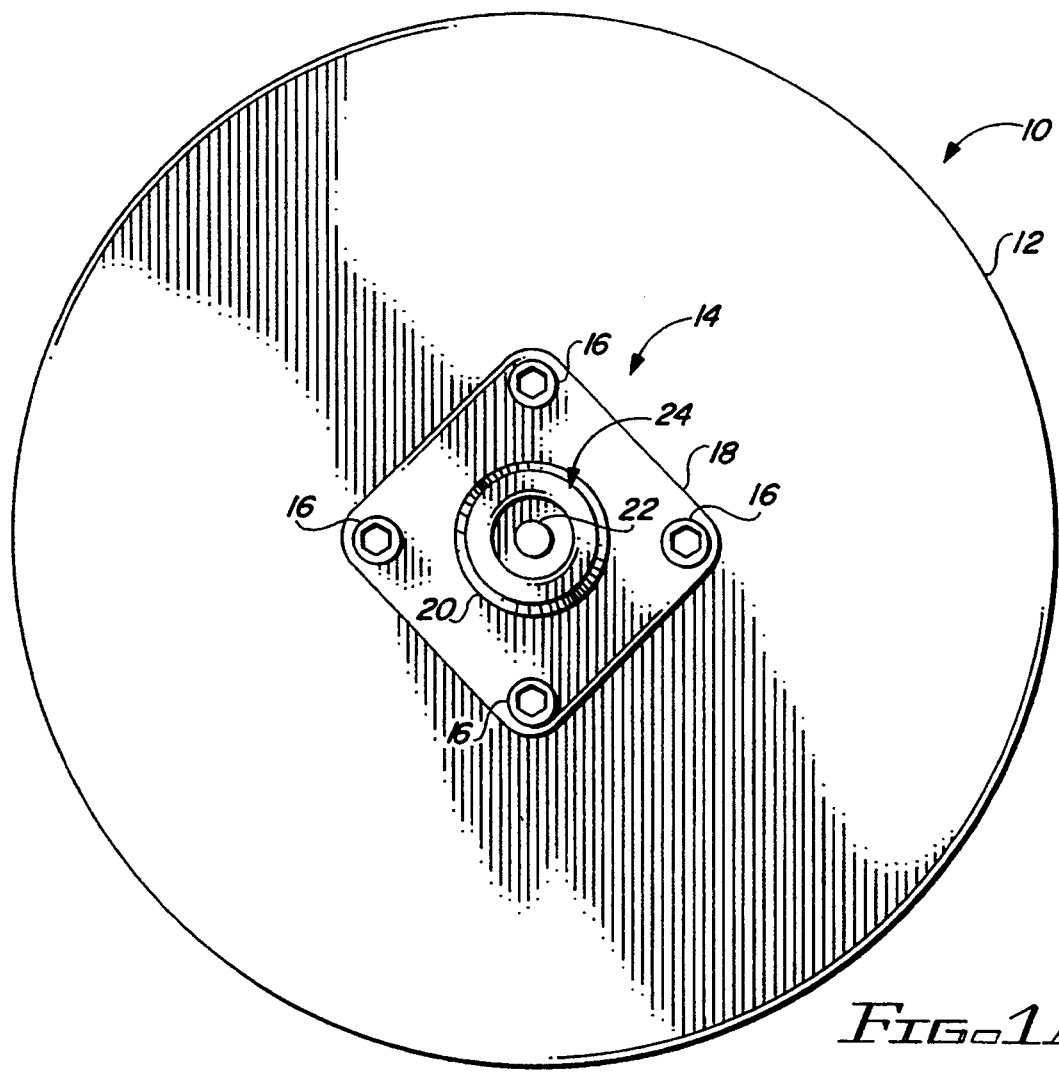
FIG. 1A is a schematic end view corresponding to FIG. 1.

FIGS. 1 and 1A depict a current detection device 10 having a mounting plate 12 in the form of a circular disc, on one side of which is mounted a conventional coaxial connector 14.[2] The coaxial connector 14 is mounted to the plate 12 by the means of mounting screws 16 which extend through the connector base plate 18 and are threaded into the mounting plate 12. The coaxial connector 14 also includes an annular shell 20 and a center conductor 22 separated by dielectric 24 in conventional fashion.

[2] It will be understood that, although the specific embodiments disclosed herein are shown as disc-shaped, they may be other shapes as well. For example, the mounting plate may be square, rectangular, triangular or any other suitable shape.

Sandwiched between the base plate 18 and the mounting plate 12 is a thin circular metal disc 30, preferably in the form of a thin film or foil. It will be understood that this thin film or foil 30 is much thinner than is apparent in FIG. 1, typically being substantially less than five mils (0.005 inch).[3] The thickness of the element 30 is selected to be less than one skin depth at the maximum frequency of the range of response of the sensing device 10.

[3] A skin depth of 0.2 mils permits an upper limit of about 10 gigahertz; 0.5 mils, about 2.5 gigahertz; and 5 mils, about 20 megahertz.

The center conductor 22 terminates short of the under-surface 32 of the base plate 18 in order to permit the mounting of a resistor 34 between, and in contact with, the inner end of the center conductor 22 and the adjacent surface of the foil element 30. The resistor 34 is preferably configured for high frequency and has a value of resistance preferably matching the output coaxial line impedance value (normally 50 ohms).

The thin metallic disc 30, which may be typically shim stock, foil or film 30, is preferably of a high resistance, nonmagnetic, oxidation resistant metal such as Inconel (80% nickel, 14% chromium and 6% iron). It is compressed between the base plate or mounting flange 18 and the plate 12 with impedance matching resistor 34 electrically connecting the center conductor 22 to the film or foil 30.

On the opposite side of the mounting plate 12 from the coaxial connector 14 is a second coaxial connector 40 having a similar construction to that of the connector 14. As indicated, it has a threaded shell 42, mounting screws 44 and an inner central conductor 46. In this case, however, the central conductor 46 is longer than that of the connector 14 so that it extends beyond the plane of the base plate 43 and through a central bore 50 in the mounting plate 12 to make contact with the surface of the film or foil 30 which is against the mounting plate 12. The second coaxial connector 40 is mounted in true alignment with the coaxial part of connector 14 and its center conductor 46 and dielectric 48 extend into the plate 12 to make contact with the film or foil 30. In use, a coax cable (not shown) is attached by cable connector to the connector 40 and conducts the current to be measured to the film or foil 30 (utilizing its full thickness).

The bore 50 in the mounting plate 12 is circular, the same size as the connector bore and is centered relative to the circumference of the mounting plate 12. The diameters of the central conductors 22 and 46 are aligned to be on the axis of the bore opening 50. The film or foil 30 is also circular and is centered on the axis of the bore opening 50, its diameter being slightly less than the spacing between the mounting screws 16, 44 of the respective coaxial connectors 14, 40.

As indicated schematically in FIG. 1, a display apparatus 52 is indicated in phantom as connectable to the coaxial connector 14 via a coaxial cable 54. The apparatus 52 is conventional and may include appropriate amplifier stages and the like for measuring and/or displaying a sample waveform present at the coaxial connector 14.

The sensor operation may be described as follows: A current source to be tested is applied to the center of the foil or film 30 with its return path being annular on a planar radius from the center as defined by the contact area of the center conductor 46 with the foil or film 30. The input current flows onto the foil or film 30 with complete penetration through its thickness and with (ideally) uniform current density throughout any given annular shell within the foil or film 30. The input current reaches the annular termination of the foil or film and flows back toward its source via the mounting plate 12 to complete the circuit. The output voltage drop, $V = IR$, across the metal foil 30 is related to the current, I, on the foil or film 30 times the frequency independent net resistance, R, of the foil or film only (i.e., input circuit contact resistance is not involved in the output). This non-inductive resistance allows the sensor resistance to be accurately calibrated on test site with an easily performed four-terminal direct current test.

This simple formula holds at high frequency in the absence of magnetic field (cancelled by equal and opposite radial current flow) and with insignificant capacitive coupling (low resistance and low signal level minimize coupling) plus appropriate circuit shielding for isolation between other parts of the input and output circuits. The output voltage across the matching resistor 34 causes a low level of current to flow in the output coax, thus minimizing the effect of output contact resistance. The electrical measuring device that displays the wave shape (the connecting devices, the current detection device 52 and the isolation between circuits) is expected to be capable of supporting the test to the desired frequency. This normally requires appropriately matched coax with small coaxial dimensions to prevent misleading response at short wavelengths.

Figure 2:
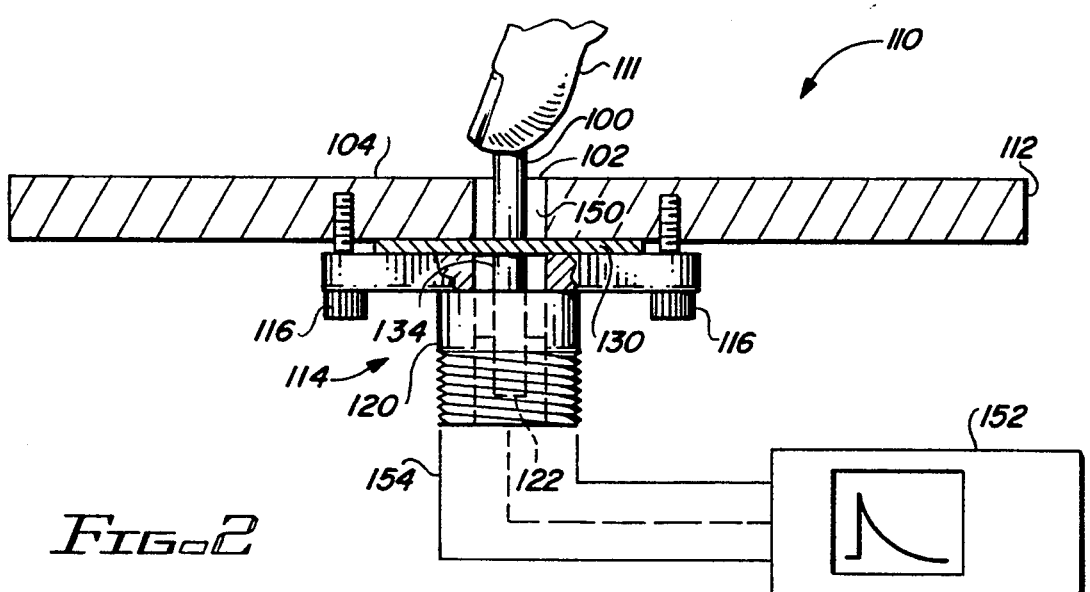
FIG. 2 is a view corresponding to FIG. 1 of another particular arrangement in accordance with the present invention particularly configured to accept an electrostatic discharge from a person's finger.

Turning now to FIG. 2, a system 110 is shown. The system 110 is like the system 10 of FIGS. 1 and 1A except that it lacks the second coaxial connector 40. Like elements are numbered alike, but with the number 100 added. Thus the system 110 includes the coaxial connector 114 mounted by screws 116 to the mounting plate 112 with a thin foil or film element 130 sandwiched between. A resistor 134, like the resistor 34, is similarly mounted in the system 110 of FIG. 2.

A cylindrical post or rod 100 is centrally positioned within the bore 150 of the plate 112, mounted within dielectric 102 affixed therein. The post 102 protrudes above the surface 104 of the plate 112 for the purpose of providing a touch point for discharging the capacitive charge of a human body by virtue of the person touching (or nearly touching) the post 102 with his finger 111. The dimensions of the strike post 100 and its surrounding dielectric 102 must be small and the paths electrically short so as not to act as a shorted halfwave coax in the ground plane at the highest test frequency. The ground plane should be as thin as practical to simulate a flat sample in the area of a normal ESD test strike.

As indicated in FIG. 2, the finger 111 of a charged person discharges an ESD pulse into target post 100 supported in plate hole 150 by dielectric 102. The target post 100 conducts the current to foil or film 130 which (utilizing its full thickness) conducts the current to the plate hole wall surrounding dielectric 102. The current returns up the hole wall, nominally utilizing three skin depths of metal of plate 112, and is capacitively coupled from plate 112 and surrounding conductors to the body of the person with finger 111. The voltage developed by the current in foil or film 130 causes current to flow through matching resistor 134 to center conductor of coax connector 114 through center conductor of cable 154 to display instrument 152 and back on outer conductor of coax cable 154 to outer conductor of the connector 114 annular connection to the radial planar connection of foil or film 130 as the voltage source return.

Figure 3:
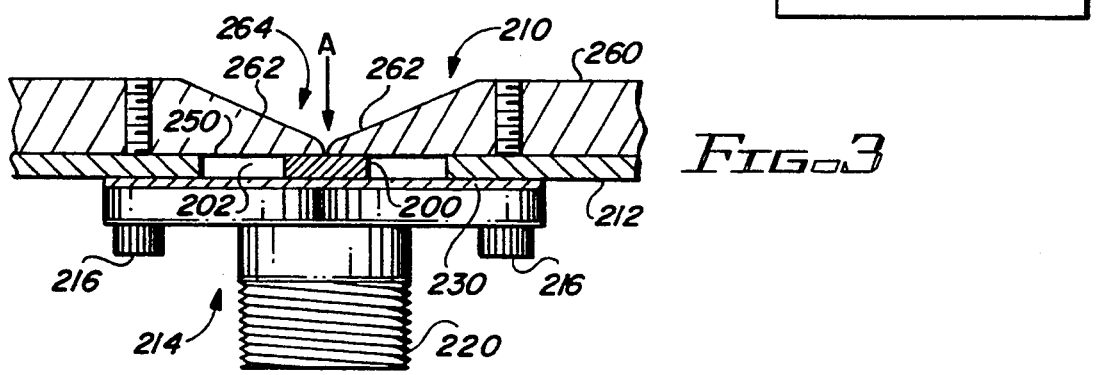
FIG. 3 is a corresponding view of another electrostatic discharge configuration adapted to accept a probe.

In FIG. 3 a somewhat different configuration of sensing device is shown, similar to the sensing device 110 of FIG. 2 but differing in that a shaped well is provided to guide the discharge member (probe or finger) to the proper discharge location. The effectiveness of the device is enhanced if the discharge member is centered relative to the foil or film so that the discharge current densities are uniform at equal radial distances from the discharge point. In FIG. 3 like reference numerals are assigned to like elements of FIG. 2 but with the addition of 100.

The sensing device 210 of FIG. 3 has a mounting plate 212 (which may be considered a ground plane for the device) to which is mounted a coaxial connector 214 by mounting screws 216 with a thin film or foil 230 sandwiched in between. In this case, the mounting screws 216 are plastic and extend through the plate 212 to secure a dielectric base board 260 on the opposite side of the plate 212. In the sensing device 210, the plate is a thin copper sheet which has a hole 250 etched symmetrically on the axis of the connector 214 and filled with dielectric 202 which holds a central flat cylindrical conductor 200 in place against the film or foil 230. The base board 260 is shaped with sloping sides 262 symmetrically situated about the central axis of the sensing device 210, forming a generally cone-shaped well 264. This well 264 acts to guide a probe member toward the proper discharge point A at the center of the film or foil 230, thus enhancing the effectiveness of the sensing device 210.

Figure 4:
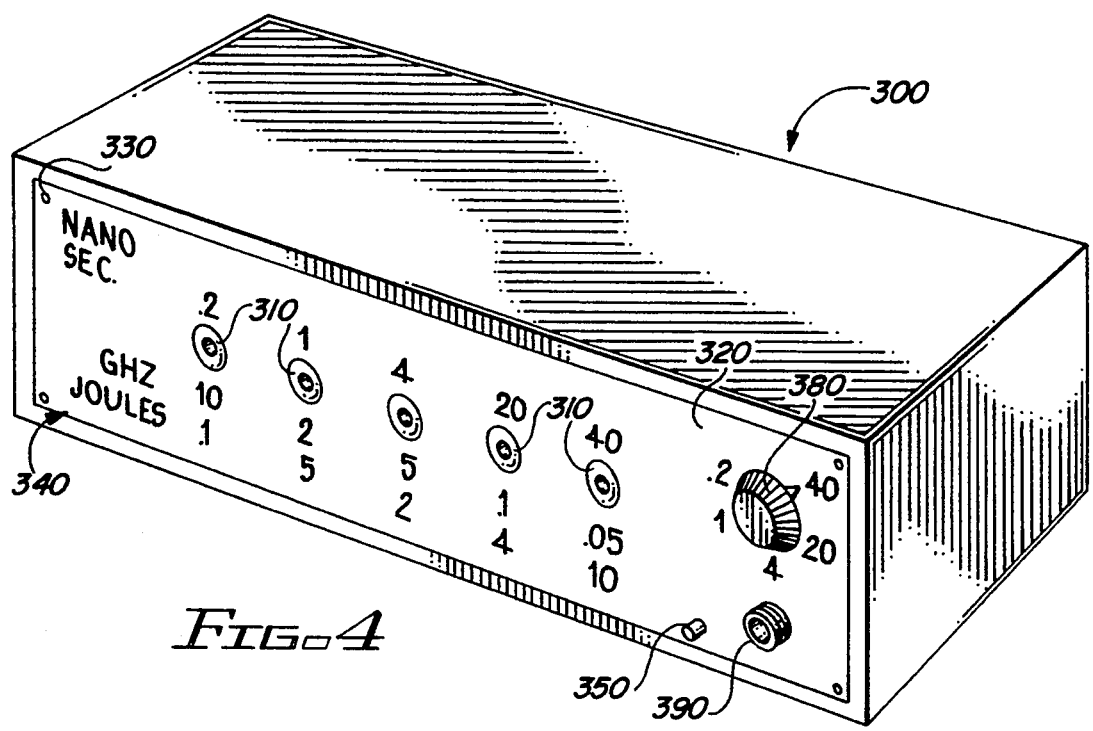
FIG. 4 is a schematic representation of a calibration chassis with a plurality of sensors of the present invention mounted to measure ESD at various levels of discharge.

FIG. 4 depicts a calibration apparatus 300 in which a plurality of sensing devices 310 are mounted to permit the calibration of a discharge path. Each of the devices 310 is configured for a different upper cutoff frequency and is selectable by the coax switch 380 which couples the selected device 310 to an output coaxial connector 390. Thus, viewing the devices 310 from left to right, they provide cutoff frequencies of 10, 2, 0.5, 0.1 and 0.05 gigahertz corresponding to energy levels of 0.1, 0.5, 2, 4 and 10 joules and rise times of 0.2, 1, 4, 20 and 40 nanoseconds, respectively.

Sensing apparatus in accordance with the present invention enables the testing and observation of signal pulse discharges at frequency ranges from D.C. to 10 gigahertz or higher with materials which are presently available. This extreme performance results from the novel configuration of the very thin film or foil element sandwiched between a coaxial connector and a mounting plate with the element symmetrically disposed about the axis of the connector. This sensing apparatus provides results which are materially improved over the test results obtainable with the present IEC standard established by Publication 801-2 of the International Electrotechnical Commission.

Although there have been described hereinabove various specific arrangements of a radial planar current detection device having an extended frequency range of response in accordance with the invention for the purpose of illustrating the manner in which the invention may be used to advantage, it will be appreciated that the invention is not limited thereto. Accordingly, any and all modifications, variations or equivalent arrangements which may occur to those skilled in the art should be considered to be within the scope of the invention as defined in the annexed claims.

What is claimed is:

1. A coaxial termination, current detection device for providing an output signal corresponding to sensed input signals within a frequency range from D.C. to 10 gigahertz comprising:

a metal plate with means defining a transverse circular opening aligned with a selected transverse axis;

a metal member of predetermined thickness located adjacent one side of said metal plate and extending across said opening and beyond the periphery thereof;

a coaxial connector positioned with its central axis in alignment with said plate transverse axis and mounted to said plate while compressing said metal member against said plate in a sandwich configuration, said connector having a shell conductor and a central conductor with dielectric between them; and a matching resistor mounted in line with said central conductor along said axis and connecting the central conductor with said metal member at said axis.

2. The device of claim 1 wherein said metal member is formed with parallel opposing sides which are separated by said predetermined thickness.

3. The device of claim 2 wherein said predetermined thickness is selected to be one skin depth at the upper frequency limit of signals to be sensed.

4. The device of claim 1 wherein the material of said metal member is a non-magnetic alloy having a high resistivity.

5. The device of claim 4 wherein said metal member material is a high resistance, non-magnetic, oxidation resistant alloy having a composition of 80% nickel, 14% chromium and 6% iron.

6. The device of claim 5 wherein said metal member is not more than 5 mils in thickness.

7. The device of claim 6 wherein said metal member is 0.2 mils in thickness for sensing signals at a frequency up to about 10 gigahertz.

8. The device of claim 6 wherein said metal member is 0.5 mils in thickness for sensing signals at a frequency up to 2.5 gigahertz.

9. The device of claim 6 wherein said metal member is 5 mils in thickness for sensing signals at a frequency up to 20 megahertz.

10. The device of claim 6 wherein said metal member is formed of shim stock.

11. The device of claim 6 wherein said metal member is formed of thin film.

12. The device of claim 1 wherein said resistor is selected to match the line impedance of the coaxial connector.

13. The device of claim 12 wherein said matching resistor has a resistance value of 50 ohms.

14. The device of claim 1 further comprising an additional conductor on the side of the metal member remote from said coaxial connector.

15. The device of claim 14 wherein said additional conductor is in contact with said metal member to provide an electrical circuit path.

16. The device of the claim 15 wherein said additional conductor is aligned along the transverse axis and centered within the opening of said metal plate.

17. The device of claim 16 wherein said additional conductor is configured to project beyond the surface of the metal plate to provide a strike post for discharging the capacity of charge of a human body upon the person coming within striking distance of the post.

18. The device of claim 16 wherein the additional conductor terminates essentially flush with the surface of the metal plate, there being a layer of dielectric positioned over the surface of the metal plate with said layer defining a conical depression centered on the transverse axis to provide a means of guiding a probe to said additional conductor.

19. The device of claim 1 further including an additional coaxial connector mounted to said metal plate on the side thereof remote from said metal member, said additional coaxial connector having a shell conductor and a central conductor with dielectric between them, said central conductor being configured to extend through said transverse opening to make electrical circuit contact with said metal member.

20. The device of claim 1 further including a display device having a coaxial cable connected to said coaxial connector for displaying waveforms corresponding to the output signals generated by said current detection device.

21. The device of claim 1 further including a measuring device having a coaxial cable connected to said coaxial connector for indicating the amplitude of output signals generated by said current detection device.

22. Calibration apparatus having a plurality of coaxial termination, current detection devices as claimed in claim 1, each of said devices being configured to respond to sensed input signals at different selected frequencies within said frequency range; an output coaxial connector for providing output signals from a selected current detection device; and coaxial switching means for selectively connecting said output coaxial connector to a selected one of said devices.

23. The apparatus of claim 22 wherein said devices are configured to sense input signals at 10 gigahertz, 2 gigahertz, 0.5 gigahertz, 0.1 gigahertz and 0.05 gigahertz, respectively.

* * * * *